(12) United States Patent
Miyatake et al.

(10) Patent No.: US 6,181,591 B1
(45) Date of Patent: Jan. 30, 2001

(54) HIGH SPEED CAM CELL

(75) Inventors: Hisatada Miyatake, Otsu; Masahiro Tanaka, Moriyama; Yotaro Mori, Shiga-ken, all of (JP)

(73) Assignee: International Business Machines Corporation, Armonk, NY (US)

( * ) Notice: Under 35 U.S.C. 154(b), the term of this patent shall be extended for 0 days.

(21) Appl. No.: 09/417,852

(22) Filed: Oct. 14, 1999

(30) Foreign Application Priority Data

Oct. 29, 1998 (JP) .................................................. 10-308121

(51) Int. Cl.[7] .............................. G11C 15/00; G11C 7/00
(52) U.S. Cl. .............................. 365/49; 365/156; 365/203
(58) Field of Search ................................. 365/49, 189.07, 365/154, 156, 203

(56) References Cited

U.S. PATENT DOCUMENTS

| | | | |
|---|---|---|---|
| 4,723,224 | * 2/1988 | Van Hulett et al. | 365/49 |
| 5,257,220 | * 10/1993 | Shin et al. | 365/49 |
| 5,446,685 | * 8/1995 | Holst | 365/49 |
| 5,703,803 | * 12/1997 | Shadan et al. | 365/49 |

* cited by examiner

*Primary Examiner*—Son Mai
(74) *Attorney, Agent, or Firm*—Robert A. Walsh

(57) ABSTRACT

A high speed and low power consumption associative memory (CAM) cell and CAM word circuit which provides an associative memory (CAM) word circuit 40. The circuit includes a word match line 20 and a plurality of associative memory (CAM) cells 35 connected in parallel to the word match line. A precharge circuit 21 charges the word match line 20, and a voltage controlling device 41 is located between the precharge circuit and the word match line.

11 Claims, 3 Drawing Sheets

HIGH SPEED CAM CELL

FIELD OF THE INVENTION

The present invention generally relates to an associative (content access) memory (CAM: Content Addressable Memory) and more particularly to a CAM cell and a constitution (called "a CAM word circuit" below in this specification) of a CAM cell, a CAM word comprising a plurality of CAM cells and a concomitant word match line.

BACKGROUND OF THE INVENTION

CAM is a memory which can search for stored data that matches reference data and read information associated with matching data, such as an address indicating a location in which the matching data is stored. As a semiconductor technology advances, CAM is required to be accessible at high speed in higher density and to consume low power.

FIG. 1 shows an example of a conventional static CAM cell (excerpted from p.310, "The Principles of CMOS VLSI Design"). A CAM cell 10 comprises a data storage part 11 comprising a pair of inverters, each comprising CMOS transistors, an output of one inverter being connected to an input of the other inverter; and transfer gates 14 and 15, each comprising an NMOS transistor, the transfer gate 14 being situated between a bit line 12 and the data storage part 11, the transfer gate 15 being situated between a bit line 13 and the data storage part 11. A word line is connected to each gate of the transfer gates 14 and 15. The CAM cell 10 further comprises NMOS transistors 16 and 17 connected in series to the bit lines 12 and 13. The respective gates of the transistors 16 and 17 are connected to the respective outputs of the inverters. A bit match node 18 between the transistors 16 and 17 is connected to the gate of an NMOS transistor 19. The transistor 19 is connected to a word match line 20 so that it functions as the transistor for driving the word match line 20.

The CAM cell 10 of FIG. 1 has problems about the low power consumption and the high speed, as described below. That is, the bit lines 12 and 13 are precharged at a high level for a read operation. In this case, the bit match node 18 reaches the high level because the transistor 16 or 17 is on. The driving transistor 19 is then turned on, so that the word match line 20 is discharged at a low level. On the other hand, a search operation requires precharging the word match line 20 at the high level. In this case, it is necessary to fix the bit lines 12 and 13 at the low level.

When a search request is received while the CAM prepares for the read operation in its stand-by state, it is therefore necessary to once discharge the bit lines 12 and 13 prior to the search operation. Then, the search operation can not start until the word match line 20 is charged to the high level. Consequently, it not only is a waste of the power but also causes the delay of the start time of the search operation to discharge the bit lines 12 and 13. Moreover, the bit lines 12 and 13 have a large capacity, and all the bit lines must be discharged for the search. Thus, this causes problems of noise generated on a grounding conductor as well as the waste of an enormous amount of power. After the end of the search, the bit lines 12 and 13 must be precharged during the stand-by state to prepare for the read operation. In this process, the electric charge on the word match line 20, which is precharged before the search operation and is not discharged due to the data match, is wasted (discharged).

On the other hand, when a read request is received while the CAM prepares for the search operation in its stand-by state, all the bit lines must be charged to a precharge state before the read operation. In this process, all the word match lines are discharged. After the read, all the bit lines are discharged and all the word match lines are precharged. Consequently, in this case, the power is wasted, and the start of the read operation is delayed. Moreover, the noise on a power supply line must be taken into account due to electric current for charging the bit lines. Besides, the conventional CAM cell 10 of FIG. 1 has a drawback that the polarity (high or low) of the data on the bit lines 12 and 13 for the read (write) must be the reverse of the polarity for the search.

FIG. 2 shows an example of a conventional CAM word circuit. A plurality of CAM cells 10 are connected in parallel to the word match line 20. A signal on the word match line 20 is output as a match signal through a buffer 23. A precharge circuit 21 is connected to the word match line 20, and thus the word match line 20 is precharged in response to a precharge signal 22.

The CAM word circuit of FIG. 2 has a problem particularly related to the power consumption, as described below. That is, the CAM word circuit of FIG. 2 consumes a large amount of power, because the word match line 20 is discharged from a power supply potential to a ground potential at data mismatch words. In CAM, in its search operation, the input data is transferred to all of memory cells and then compared to the stored data. In the conventional circuit form including a constitution of FIG. 2, all of the word match lines in the words at the addresses whose data do not match the input word are discharged. Thus, the total power consumption is significantly influenced by the power for charging and discharging the word match line. Specifically, assuming that the total capacitance of the word match line is indicated by C, that the potential difference between the charge state and the discharge state is indicated by V and that the search frequency is indicated by f, the power consumption at the word match lines is equal to $fCV^2$ and proportional to the square of the voltage amplitude V. Therefore, the high voltage amplitude of the word match line is very disadvantageous to the achievement of the lower power consumption.

An object of the present invention is to solve the above problems and more particularly to provide a CAM cell and a CAM word circuit which operate at high speed and consume low power.

SUMMARY OF THE INVENTION

According to one aspect of the present invention, there is provided an associative memory (CAM) cell (30) comprising: a pair of inverters (11), an output of one inverter being connected to an input of the other inverter; a pair of first and second switches (14 and 15), the first switch being situated between the output of one inverter of the pair of inverters and one bit line of a pair of bit lines (12 and 13), the second switch being situated between the output of the other inverter of the pair of inverters and the other bit line of the pair of bit lines, the first and second switches being turned on or off in response to a signal on a word line connected to each of the first and second switches; a pair of third and fourth switches (16 and 17), the third switch being situated between one bit line of the pair of bit lines and a bit match node (18), the fourth switch being situated between the other bit line of the pair of bit lines and the bit match node, the third and fourth switches being turned on or off in response to the signal output from each inverter of the pair of inverters; and a fifth switch (25) connected to a word match line (20) and the bit match node, the fifth switch being turned on or off in accordance with a potential of the bit match node, for discharging the word match line, wherein the fifth switch is turned on when the potential of the bit match node is low, and the fifth switch is turned off when the potential of the bit match node is high.

According to another aspect of the present invention, there is provided an associative memory (CAM) word circuit (40) comprising: a word match line (20); and a plurality of associative memory (CAM) cells (35) connected in parallel to the word match line, wherein each of the CAM cells comprises: a pair of inverters (11), an output of one inverter being connected to an input of the other inverter; a pair of first and second switches (14 and 15), the first switch being situated between the output of one inverter of the pair of inverters and one bit line of a pair of bit lines, the second switch being situated between the output of the other inverter of the pair of inverters and the other bit line of the pair of bit lines, the first and second switches being turned on or off in response to a signal on a word line connected to each of the first and second switches; a pair of third and fourth switches (16 and 17), the third switch being situated between one bit line of the pair of bit lines and a bit match node, the fourth switch being situated between the other bit line of the pair of bit lines and the bit match node, the third and fourth switches being turned on or off in response to the signal output from each inverter of the pair of inverters; and a fifth switch (25) connected to the word match line and the bit match node, the fifth switch being turned on or off in accordance with a potential of the bit match node, for driving the word match line, and the fifth switch is turned on when the potential of the bit match node is low, and the fifth switch is turned off when the potential of the bit match node is high.

According to a further aspect of the present invention, there is provided an associative memory (CAM) word circuit (40) comprising: a word match line (20); a plurality of associative memory (CAM) cells (35) connected in parallel to the word match line; a precharge circuit (21) for charging the word match line; a voltage controlling device (41) situated between the precharge circuit and the word match line; and a sense-amplifier (42) situated on the word match line, for sensing and amplifying a signal on the word match line.

DESCRIPTION OF THE PREFERRED EMBODIMENT

Figure 3:
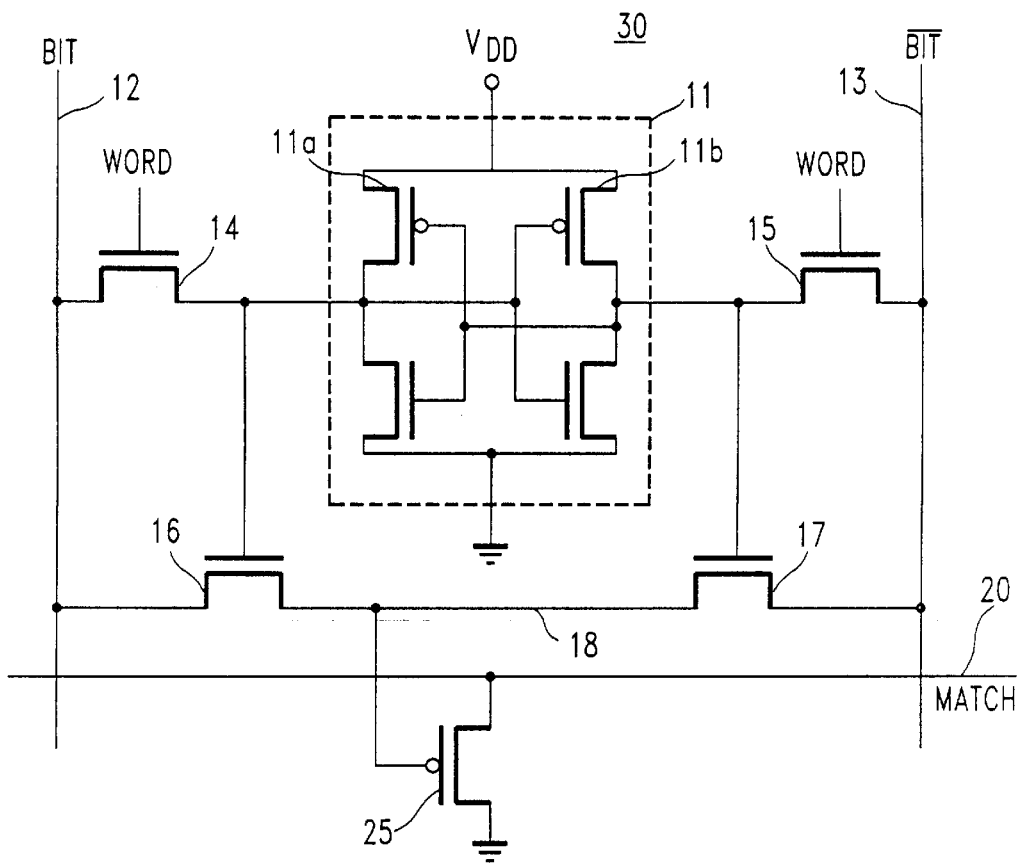
FIG. 3 illustrates an embodiment of the CAM cell of the present invention.

FIG. 3 shows an embodiment of a CAM cell of the present invention. A CAM cell 30 comprises a data storage part 11 comprising a pair of inverters, each comprising CMOS transistors, an output of one inverter being connected to an input of the other inverter; and transfer gates 14 and 15, each comprising an NMOS transistor, the transfer gate 14 being situated between a bit line 12 and the data storage part 11, the transfer gate 15 being situated between a bit line 13 and the data storage part 11. A word line is connected to each gate of the transfer gates 14 and 15. The CAM cell 30 further comprises NMOS transistors 16 and 17 connected to the bit lines 11 and 12. The respective gates of the transistors 16 and 17 are connected to the respective outputs of the inverters. A bit match node 18 between the transistors 16 and 17 is connected to the gate of a PMOS transistor 25. The transistor 25 is connected to a word match line 20 so that it functions as the transistor for discharging (driving) the word match line 20. Compared to a conventional CAM cell 10, a constitutional novelty of the present invention is that the NMOS transistor is replaced as the driving transistor 25 by the PMOS transistor. In the CAM cell of the present invention, this allows a signal on the bit lines to have the signal polarity common to all of read, write and search.

How the CAM cell 30 of FIG. 3 operates will now be described.

For reading data stored in the CAM cell 30, the bit lines 12 and 13 are first precharged at a high level (e.g., a power supply potential). Then, the word lines are changed to the high level so that the transfer gates 13 and 14 are allowed to conduct. Then, the level of the bit line 12 is changed to the level corresponding to the output from a left inverter 11a in the drawing, and the level of the bit line 13 is changed to the level corresponding to the output from a right inverter 11b. Then, the transistor 16 or 17 is turned on, so that the bit match node 18 reaches the high level. At this time, the driving transistor (PMOS) 25 remains off, and thus the word match line 20 keeps the high level.

Also for writing the data to the CAM cell 30, the bit lines 12 and 13 are first precharged at the high level. Then, the word lines are changed to the high level so that the transfer gates 14 and 15 are allowed to conduct. Then, the level of the bit line 12 is changed to the level of information to be stored, while the level of the bit line 13 is changed to the opposite level. In this case, as in the case of the read of the stored information, the driving transistor (PMOS) 25 remains off, and thus the word match line 20 keeps the high level.

Next, for searching for the data in the CAM cell 30, the match line is precharged at the high level. In this case, unlike the prior art, it is not necessary to beforehand precharge the bit lines 12 and 13 at a low level (e.g., a ground potential). For example, for searching the data storage part 11 for the low level, the bit lines 12 and 13 are changed to the low level and the high level, respectively. In this case, when the low level information is actually stored in the data storage part 11 (where the output from the inverter 11a is defined as the information stored in the data storage part 11), the transistor 16 does not conduct, whereas the transistor 17 conducts. Since the bit line 13 is at the high level, the bit match node 18 reaches the high level. Consequently, the driving transistor (PMOS) 25 remains off, and thus the word match line 20 keeps the high level. When the data stored in the data storage part 11 is at the high level, the transistor 16 conducts, whereas the transistor 17 does not conduct (because the output from the inverter lib is at the low level). Since the bit line 12 is at the low level, the driving transistor 25 is turned on and thus conducts. Consequently, the match line 20 is discharged to the low level. That is, when search information matches the stored information, the match line 20 keeps the high level. On the other hand, when the search information does not match the stored information, the match line 20 is changed to the low level.

How the CAM cell 30 of the present invention operates has been described above. Compared to the conventional CAM cell 10, the CAM cell 30 has a feature as described below.

Figure 1:
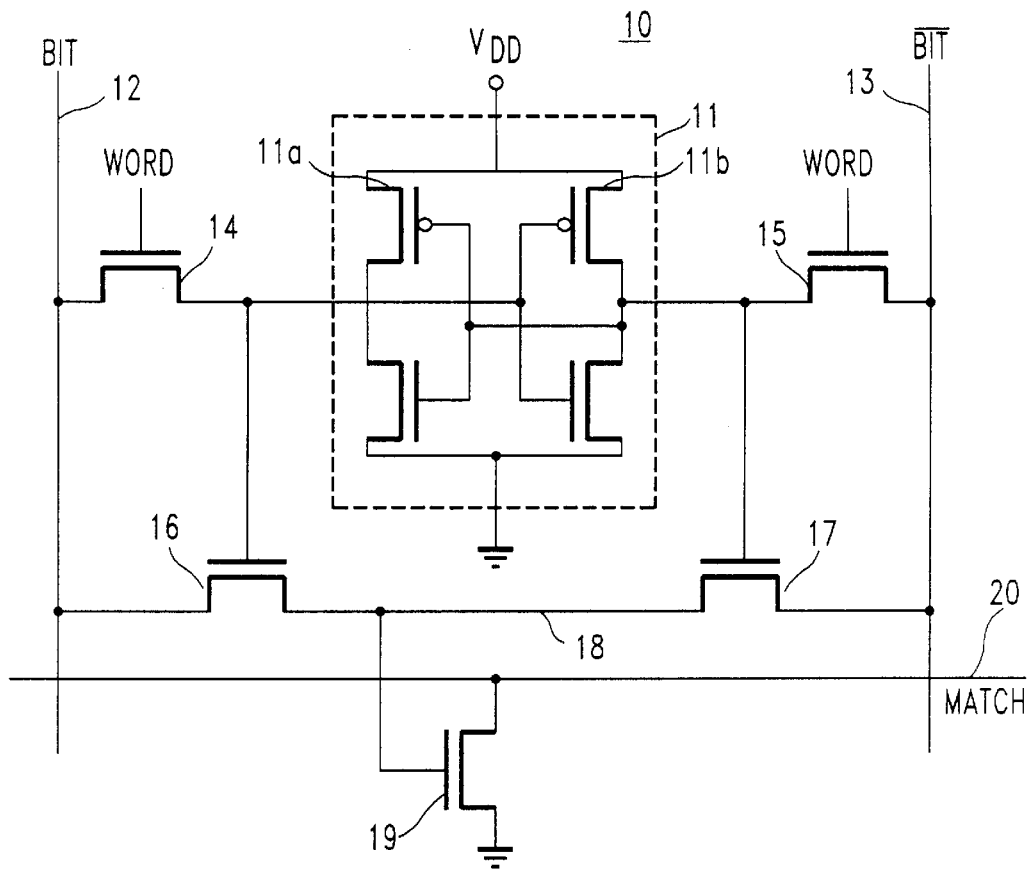
FIG. 1 illustrates an example of a conventional CAM cell.
Figure 2:
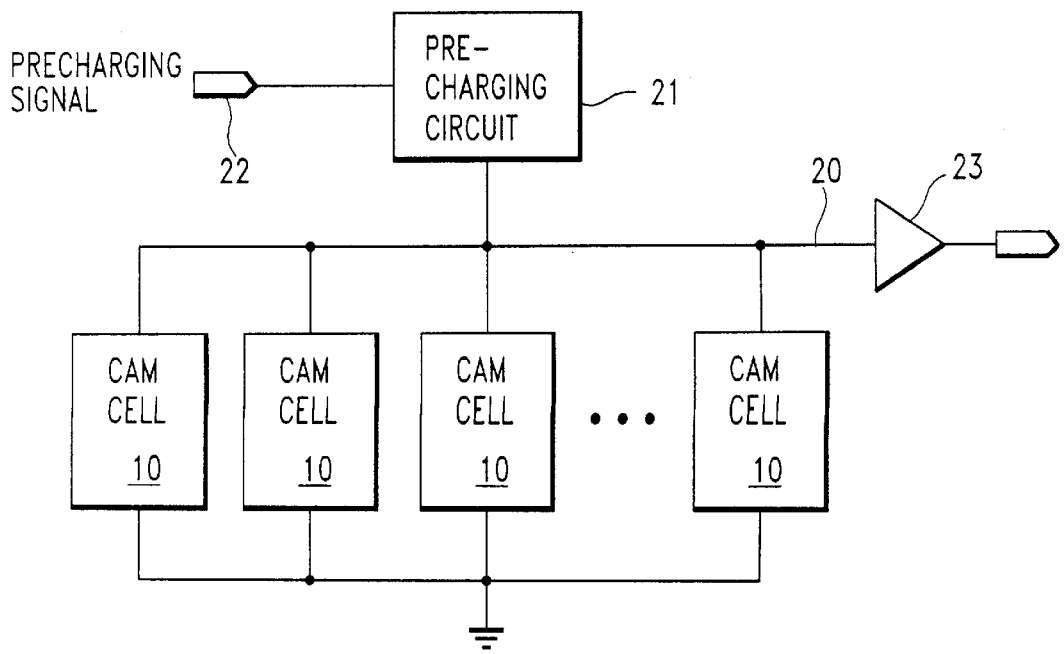
FIG. 2 illustrates an example of a conventional CAM word circuit.

In FIG. 1, when the bit lines 12 and 13 are precharged at the high level in order to prepare for the read operation, the output from the comparator circuit, i.e., a potential V of a gate node of the transistor 25 for driving the word match line is expressed as:

$V$=(power supply potential $Vcc$)−($Vt$ of MOS transistor)

Even if the word match line is precharged to the high level which may vary from the potential V above to the power supply potential Vcc, the transistor 25 is not turned on. This means that the word match line is precharged for the search operation. As a result, this state at the stand-by time permits preparing for both of the read and search operations. As soon as a request for any operation is received, that operation can be started without wasting the power (the stand-by state for the write operation is originally the same as that for the read operation).

As described above, when the corresponding bit of input data matches the stored data bit, the gate node of the driving transistor 25 stays at the high level and thus the transistor 25 keeps off. Therefore, the transistor 25 does not discharge the word match line. When the match is detected in all the bits connected in parallel, the word match line is not discharged and it stays at the high level and indicates the word match. When the mismatch is detected in any bit included in the word, the transistor for driving the word match line in the cell of the mismatch bit is turned on, so that the word match line is discharged and indicates the mismatch.

Figure 4:
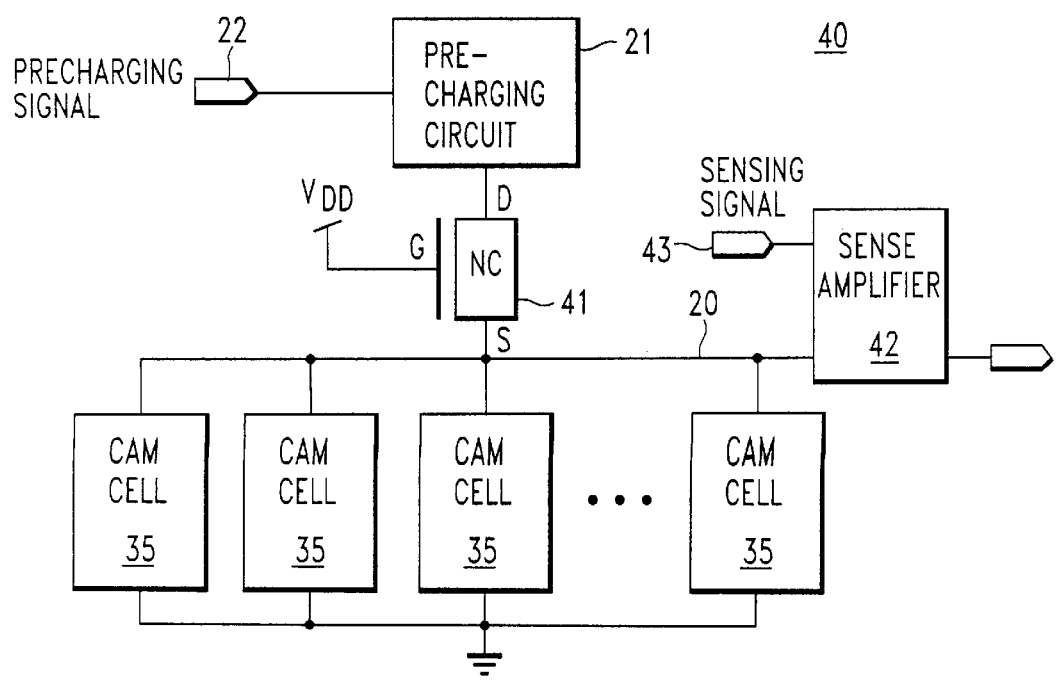
FIG. 4 illustrates an example of the CAM word circuit of the present invention.

FIG. 4 shows an example of a CAM word circuit of the present invention. A plurality of CAM cells 35 are connected in parallel to the word match line 20. The CAM cell 35 may be any CAM cell (e.g., the CAM cell 10 of FIG. 1) as well as the CAM cell 30 of the present invention shown in FIG. 3. The signal on the word match line 20 is output as a match signal through a sense-amplifier 42. Also, a precharge circuit 21 is connected to the word match line 20 through an NMOS transistor 41.

How the CAM word circuit of the present invention of FIG. 4 operates will be described taking the case of the use of the CAM cell 30 of FIG. 3 as the CAM cell 35.

During the precharge, the word match line 20 is charged by the precharge circuit 21 through the NMOS transistor 41. The potential of the precharged word match line is lower by the threshold voltage than the gate potential of the NMOS transistor 41 for limiting the voltage. When the gate of the NMOS transistor 41 is set to the power supply potential, the potential of the word match line is lower by the threshold voltage than the power supply potential. When the potential of the word match line 20 increases, the NMOS transistor 41 is strongly back-gate-biased. Thus, the threshold voltage increases due to a back gate bias effect. As a result, the potential of the word match line is further lower by this increase. By lowering the gate potential of the NMOS transistor 41, the potential of the charged word match line 20 can be further reduced.

When the circuit enters the search operation after the precharge, the data are sent onto the bit line pairs and compared to the data stored in the CAM cells 35. When a mismatch is detected in any bit in the word, the PMOS transistor 25 (FIG. 3) for driving the word match line in the CAM cell of the mismatch bit is turned on, so that the word match line 20 is discharged. When the potential of the word match line 20 drops to some extent, the sense-amplifier 42 detects this drop. Even the lowest potential of the word match line 20 is higher by the threshold voltage than the gate potential of the driving PMOS transistor 25 (FIG. 3). Furthermore, when the potential of the word match line 20 drops, the driving PMOS transistor 25 (FIG. 3) in the CAM cell 35 is strongly back-gate-biased, and thus the threshold voltage increases. Consequently, even if the gate of the PMOS transistor 25 is driven to the ground potential, the potential of the word match line 20 drops to, at the lowest, the potential which is higher by the threshold voltage than the ground potential. By increasing, the potential of the gate, the potential of the word match line 20 can be further increased.

Accordingly, a voltage amplitude of the word match line 20 is confined within a range of the potentials higher than the ground potential by the threshold voltage of the back-gate-biased PMOS transistor 25 (FIG. 3), and lower than the power supply potential by the threshold voltage of the back-gate-biased NMOS transistor 41. Moreover, the range can be further reduced. Consequently, the voltage amplitude of the word match line is made smaller, and thus the power consumption can be reduced.

In addition, the reduction of the precharge potential of the word match line 20 has the following effect as well as the reduction of the power consumption. Since the word match line 20 is a source end of the PMOS transistor 25 for driving the word match line in the CAM cell 30, the gate potential of this PMOS transistor 25 must be higher than the potential of the word match line in order to suppress the subthreshold current of this transistor. When the precharge potential of the word match line 20 is equal to the power supply potential, the gate potential of the PMOS transistor 25 must be therefore increased to about the power supply potential. For this purpose, it is necessary to use the PMOS transistor as the transistor constituting the comparator circuit in the CAM cell or to increase (boost) the potential of the bit line. In any case, the high-speed operation of the comparator circuit is sacrificed. In other words, the reduction of the precharge potential of the word match line makes it possible to use the NMOS transistor as the comparator circuit in the cell and eliminate the need for the boost in the bit line, whereby it contributes to suppressing the subthreshold current and also ensuring the high-speed operation.

Figure 5:
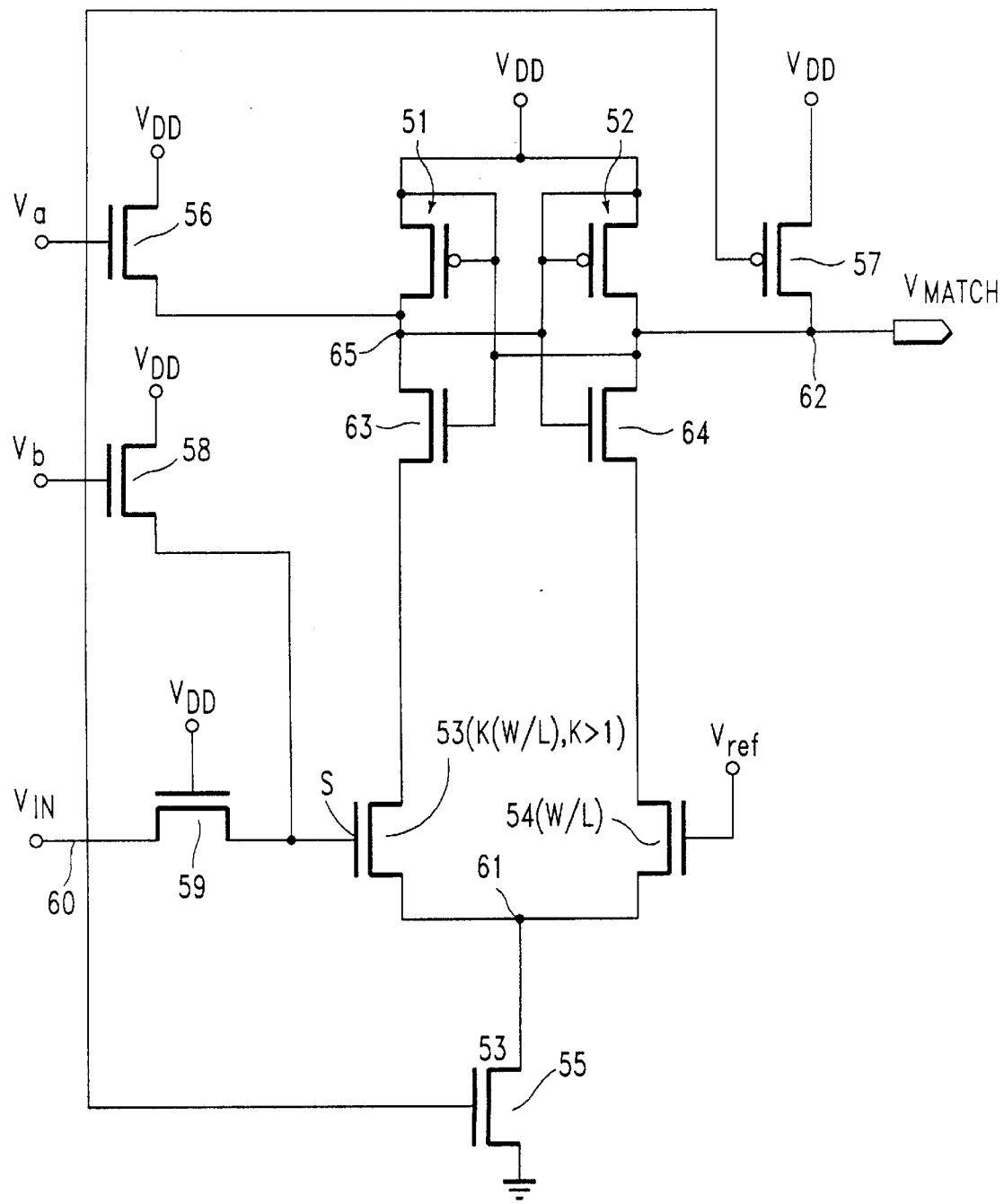
FIG. 5 shows an example of a sense-amplifier 42 for use in a CAM word circuit 40 (shown in FIG. 4) of the present invention.

FIG. 5 shows an example of the sense-amplifier 42 for use in a CAM word circuit 40 (FIG. 4) of the present invention. Two inverters 51 and 52, each comprising CMOS, are connected in a loop. The respective drains of sensing (NMOS) transistors 53 and 54 are connected in series to the respective source ends of the inverters. Precharging (PMOS) transistors 56 and 57 are connected to the respective outputs of the inverters. A differential sense-amplifier is used in the example of FIG. 5. This amplifier takes the form of the circuit in which each of both the sensing transistors 53 and 54 has the gate connected to a differential input signal and the source connected to a constant current source (NMOS transistor) 55 as the node common to both the sensing transistors. An appropriate difference is set in the intrinsic driving power between the two sensing transistors 53 and 54 in order to use the differential sense-amplifier in the single-end fashion by the use of a simple reference potential Vref. That is, a structural parameter β, e.g., a ratio of channel width W to channel length L (W/L), of the sensing transistor 53 is made different from that of the sensing transistor 54, whereby the appropriate difference is created in the intrinsic driving power between both the sensing transistors. Specifically, the intrinsic driving power of the sensing transistors can be increased by increasing the W/L ratio.

A gate terminal of the sensing transistor 54 having the low intrinsic driving power (the low W/L ratio) is connected to a supply source of the reference potential Vref. A word match line 60 is connected directly or through some voltage or current limiting device to the gate of the sensing transistor 53 having the high intrinsic driving power (the high W/L ratio). In FIG. 5, the word match line 60 is connected to the gate through a transistor 59. The gate terminal of the sensing transistor 53 having the high intrinsic driving power is herein called a sense point S. The potential which does not need a reference potential generating circuit can be herein assumed as the reference potential. When the sensing device comprises NMOS as shown in FIG. 5, the power supply of the whole circuit can be used as the supply source of the reference potential. Of course, any reference potential generating circuit including the one highly sophisticated can also be used.

How the sense-amplifier of FIG. 5 operates will be described.

During the precharge, the word match line 60 is charged by a precharging transistor 58. At this time, the sense point S is charged to the reference potential (the power supply potential). The NMOS transistor 59 for limiting the voltage may be provided or eliminated. With the NMOS transistor 59, the word match line 60 is charged to the potential which is lower than the power supply potential by the threshold voltage of the transistor 59. Without the NMOS transistor 59, the word match line 60 is charged to the power supply potential. When the potential of the word match line 60 rises, this NMOS transistor 59 is strongly back-gate-biased. Thus, the threshold voltage increases due to the back gate bias effect. Consequently, the potential of the word match line 60 is further lower because of the larger threshold voltage of the n-MOS transistor. In any case, the sense point S is charged to the power supply potential (the reference potential). In this state, the sense point S waits for the start of the sensing.

In a precharge state, a signal Va for activating the sense-amplifier is fixed to "L", and the sense-amplifier is in a stand-by state. At this time, a common node (called a set node) 61 of the sense-amplifier has the potential which is lower than the power supply potential by the threshold voltage Vt of NMOS. As a result, the current does not flow through the sense-amplifier.

When the circuit enters the search operation after the precharge, the data is carried on the bit line pair and compared to the data stored in the cell, as described above. When the mismatch is detected in at least one bit in the word, the transistor for driving the word match line in the cell of the mismatch bit is turned on, so that the word match line is discharged. The match line of the word that matches the input data does not change in the potential thereof, thus the sense point S stays at the power supply potential. At the time when the potential of the sense point S of the mismatch word drops to some extent, the signal Va for activating the sense-amplifier is driven to "H" so that the sense-amplifier is activated. This timing can be determined by using an appropriate circuit for simulating a behavior of the sense point S, as is often the case with DRAM or the like.

Both of the differential inputs to the sense-amplifier of the word that matches the input data have the power supply potential. However, the sensing transistor 53, which the sense point S is applied to, has the higher driving power than the sensing transistor 54 which the reference potential (the power supply potential in this case) is applied to. Therefore, the sense-amplifier operates as if the potential of the sense point were higher than that of a reference point. Consequently, the sense point is recognized as "H".

The match line 60 of the word that does not match the input data has the decreased potential. Thus, in the sense-amplifier, the sensing transistor 54 connected to the reference potential is turned on earlier than the sensing transistor 53 connected to the sense point, so that the potential of a node 62 starts dropping. When the potential of the set node 61 further drops, the sensing transistor 53 is turned on. However, since an overdrive of the gate of the sensing transistor 53 is lower than that of the sensing transistor 54 and the potential of the node 62 is already a little lowered, the driving power of an NMOS transistor 63 constituting the inverter 51 is lower than that of an NMOS transistor 64 constituting the inverter 52. Therefore, when the potential of the sense point S is lower by some extent, even the transistor 53 having the higher intrinsic driving power does not reverse the potentials of the nodes 62 and 65. The potential of the node 62 further drops and reaches the ground level, whereas the potential of the node 65 is fixed to the power supply potential. That is, the sense point S is recognized as "L", and the signal indicating "mismatch" is output from the sense-amplifier.

To what extent the potential of the sense point S drops when the sense point S is recognized as "L", i.e., the threshold voltage of the sense-amplifier depends on the difference in the intrinsic driving power between the sensing transistors 53 and 54. Thus, the threshold voltage can easily be controlled by appropriately setting the W/L ratio. The threshold voltage of the sense-amplifier does not depend on the intrinsic threshold voltage Vt of the transistor. The intrinsic driving powers can be determined in consideration of a noise margin.

By utilizing a sense-amplifier like the sense-amplifier 42 used as an example in the present specification, the signal indicating the word match or mismatch can be transferred to the following stage when a small signal appears at the sense point. Therefore, the search operation is executed at high speed. The use of this type of sense-amplifier is more effective as the word width becomes larger, because the word match line of a wider word has larger parasitic capacitance, and thus moves more slowly.

After the end of the amplification, the output VMATCH of the sense-amplifier has the power supply potential or the ground potential depending on whether the sense point S has the potential near the power supply potential level or lower than that. The input VIN of the sense-amplifier has only to move by the input sensitivity of the sense-amplifier (typically, about 300 mV to 700 mV) which is determined in the design. Thus, the match line is controlled in this manner, whereby the current for charging and discharging the match line 60 for driving the input to the sense-amplifier is significantly reduced.

Furthermore, after the end of the amplification, the result of the amplification is latched and held as far as the transistors 53 and 54 in the sense-amplifier conduct. This is one of excellent features of this sense-amplifier. Accordingly, as soon as the sensing terminates, a precharge control signal Vb can be set to "L" so that the sense point S and the match line 60 are precharged, whereby the CAM word can prepare for the next search operation while maintaining and outputting the search result. That is, the cycle time of the search operation can be reduced. Moreover, after the completion of the amplification, i.e., after the completion of the latch, a path from the power supply to the ground is cut off, and thus no current flows through the sense-amplifier.

As described above, the transistor 59 inserted for limiting the voltage of the match line 60 may be provided or eliminated. When the voltage limiting transistor is used, the precharge potential of the match line 60 is suppressed at the voltage lower than the power supply potential by Vt of the transistor. Thus, the power consumption for charging and discharging the match line is further reduced. In addition, advantageously, the sense point S responds rapidly due to a charge sharing when the potential of the match line begins dropping.

Thus it is apparent that there has been provided, in accordance with the invention, an improved associated memory (CAM) which fully meets the objects and advantages set forth above. While the invention has been described and illustrated with reference to specific embodiment thereof, it is not intended that the invention be so limited. Those skilled in the art, after consideration of the foregoing description, will recognize that many variations and modifications are possible which still fall within the broad scope of the invention.

What is claimed is:

1. An associative memory (CAM) cell comprising:
    a pair of CMOS inverters, an output of one inverter being connected to an input of the other inverter;
    a pair of first and second NMOS switches, said first switch being situated between the output of one inverter of said pair of CMOS inverters and one bit line of a pair of bit lines, said second switch being situated between the output of the other inverter of said pair of inverters and the other bit line of said pair of bit lines, said first and second switches being turned on or off in response to a signal on a word line connected to each of said first and second switches;
    a pair of third and fourth NMOS switches, said third switch being situated between one bit line of said pair of bit lines and a bit match node, said fourth switch being situated between the other bit line of said pair of bit lines and said bit match node, said third and fourth switches being turned on or off in response to the signal output from each inverter of said pair of inverters; and
    a fifth P-type MOS switch connected to a word match line and said bit match node, said fifth switch being turned on or off in accordance with a potential of said bit match node, for discharging said word match line,
    wherein said fifth PMOS switch is turned on when the potential of said bit match node is low, and said fifth switch is turned off when the potential of said bit match node is high.

2. An associative memory (CAM) word circuit comprising:
    a word match line; and
    a plurality of associative memory (CAM) cells connected in parallel to said word match line,
    wherein each of said CAM cells comprises:
    a pair of CMOS inverters, an output of one inverter being connected to an input of the other inverter;
    a pair of first and second NMOS switches, said first switch being situated between the output of one inverter of said pair of CMOS inverters and one bit line of a pair of bit lines, said second switch being situated between the output of the other inverter of said pair of inverters and the other bit line of said pair of bit lines, said first and second switches being turned on or off in response to a signal on a word line connected to each of said first and second switches;
    a pair of NMOS third and fourth switches, said third switch being situated between one bit line of said pair of bit lines and a bit match node, said fourth switch being situated between the other bit line of said pair of bit lines and said bit match node, said third and fourth switches being turned on or off in response to the signal output from each inverter of said pair of inverters; and
    a fifth P-type MOS switch connected to said word match line and said bit match node, said fifth switch being turned on or off in accordance with a potential of said bit match node, for driving said word match line, and
    said fifth PMOS switch is turned on when the potential of said bit match node is low, and said fifth switch is turned off when the potential of said bit match node is high.

3. The CAM word circuit according to claim 2, further comprising:
    a precharge circuit for precharging said word match line; and
    a voltage controlling device situated between said precharge circuit and said word match line.

4. The CAM word circuit according to claim 3, further comprising:
    a sense-amplifier situated on said word match line, for sensing and amplifying a signal on said word match line.

5. The CAM word circuit according to claim 3, wherein said voltage controlling device comprises a MOS transistor.

6. An associative memory (CAM) word circuit comprising:
    a word match line;
    a plurality of associative memory (CAM) cells connected in parallel to said word match line;
    a precharge circuit for charging said word match line; and
    a switch situated between said precharge circuit and said word match line.

7. The CAM word circuit according to claim 6, wherein said switch comprises a MOS transistor.

8. The CAM word circuit according to claim 6, wherein each of said CAM cells comprises:
    a pair of inverters, an output of one inverter being connected to an input of the other inverter;
    a pair of first and second switches, said first switch being situated between the output of one inverter of said pair of inverters and one bit line of a pair of bit lines, said second switch being situated between the output of the other inverter of said pair of inverters and the other bit line of said pair of bit lines, said first and second switches being turned on or off in response to a signal on a word line connected to each of said first and second switches;
    a pair of third and fourth switches, said third switch being situated between one bit line of said pair of bit lines and a bit match node, said fourth switch being situated between the other bit line of said pair of bit lines and said bit match node, said third and fourth switches being turned on or off in response to the signal output from each inverter of said pair of inverters; and
    a fifth switch connected to said word match line and said bit match node, said fifth switch being turned on or off in accordance with a potential of said bit match node, for driving said word match line, and
    said fifth switch is turned on when the potential of said bit match node is low, and said fifth switch is turned off when the potential of said bit match node is high.

9. The CAM word circuit according to claim 8, wherein said fifth switch comprises a P-type MOS transistor.

10. The CAM word circuit according to claim 9, wherein each of said inverters comprises CMOS transistors, each of said first to fourth switches comprises an NMOS transistor, and said fifth switch comprises a PMOS transistor.

11. The CAM word circuit according to claim 6, further comprising:
    a sense-amplifier situated on said word match line, for sensing and amplifying a signal on said word match line.

* * * * *